United States Patent [19]

Levinson

[11] Patent Number: 5,015,618

[45] Date of Patent: May 14, 1991

[54] LASER ZONE MELTED BI—SR—CA—CU—O THICK FILMS

[75] Inventor: Mark Levinson, Sudbury, Mass.

[73] Assignee: GTE Laboratories Incorporated, Waltham, Mass.

[21] Appl. No.: 423,998

[22] Filed: Oct. 19, 1989

[51] Int. Cl.$^5$ .................. H01L 39/24; H01L 39/00
[52] U.S. Cl. .................. 505/001; 156/610; 427/53.1; 427/62; 437/910; 428/930; 505/729
[58] Field of Search .................. 156/610; 437/910; 505/001, 729; 428/930; 427/53.1, 62

[56] References Cited

U.S. PATENT DOCUMENTS

| | | | |
|---|---|---|---|
| 4,931,424 | 6/1990 | Henty | 505/001 |
| 4,940,842 | 7/1990 | Schultz et al. | 427/62 |
| 4,962,085 | 10/1990 | de Barbadillo, II et al. | 505/1 |

FOREIGN PATENT DOCUMENTS 0285106 10/1988 European Pat. Off. ............ 437/910

OTHER PUBLICATIONS

Levinson et al., Appl. Phys. Letts., 55 (16 Oct. 1989) 1683.
Liu et al., Supercond. Sci. Technol. 1 (1989) 254.
Feigelson et al., Science, 240 (17 Jun. 1988) 1642.
Gazit et al., Jour. Crystal Growth, 91 (1988) 318.
Takekawa et al., Jour. Crystal Growth, 92 (Oct. 1988) 687.
Moon et al., Appl. Phys. Letts. 55 (2 Oct. 1989) 1466.

Primary Examiner—Upendra Roy
Attorney, Agent, or Firm—Frances P. Craig

[57] ABSTRACT

A method for preparing a highly aligned thick film of superconducting bismuth strontium calcium copper oxide ceramic material to improve its critical current density. A film about 5–200 $\mu$m thick of bismuth strontium calcium copper oxide is deposited on a suitable substrate. The ratios of Bi:(Sr, Ca):Cu in the film are about 2:3:2 to 2:4:3. A laser beam is translated over the deposited film at a rate of about 0.2–15 cm/hr while the film is held at a temperature of about 500°–950° C. The beam is about 0.01–0.50 cm wide along the direction of translation, and provides about 0.2–10W of optical power to the film. The temperature and the beam translation rate, width, and optical power are selected to permit zone melting and resolidification of the film to form the highly aligned thick film of superconducting bismuth strontium calcium copper oxide ceramic material. The $J_c$ may, if desired, be further improved by annealing the resolidified film at about 900°–965° C. for about 1–300 hr.

5 Claims, 6 Drawing Sheets

LASER ZONE MELTED BI—SR—CA—CU—O THICK FILMS

BACKGROUND OF THE INVENTION

This invention relates to an improved method for preparing bismuth strontium calcium copper oxide compounds, and in particular to a method resulting in highly grain aligned thick films of such compounds exhibiting improved superconducting critical current densities.

One of the most critical properties of superconductors from the standpoint of their utility in practical applications is the critical current density, $J_c$, of the superconductor at the temperature of intended use. Although very high $J_c$'s, for example about $10^6$ A/cm$^2$ at 77° K., have been demonstrated in epitaxial single crystal films of the new high temperature ceramic superconductors, the best values achieved for polycrystalline forms of the superconductors have been two to four orders of magnitude lower. The difference may be attributed to the anisotropic nature of conduction in the crystal structure, the poor conduction properties at grain boundaries, and the porosity of most sintered bulk materials.

High temperature superconductor thick films (about 5–200 μm thick) have great potential for applications such as those involving chip-to-chip interconnects and passive microwave devices. Although the very high critical current densities demonstrated at 77° K. in epitaxial YBa$_2$Cu$_3$O$_x$ thin films would be more than sufficient for these kinds of applications, the $J_c$'s exhibited by polycrystalline high temperature superconductors have been disappointingly low. One approach to this problem is the development of processes which will yield 100% dense material with high current density a-b crystal planes aligned parallel to the direction of current flow, and with minimal grain boundaries which are not parallel to that direction. Such a morphology would take the form of either a single crystal or a textured microstructure with the grains aligned substantially perpendicular to their c-axes.

One method of forming textured microstructures is directional solidification from the melt. S. Jin et al. (*Appl. Phys. Lett.* 52, 2074 (1988)) disclose a temperature gradient freeze method for making high current density YBa$_2$Cu$_3$O$_x$ bulk samples. Laser floating zone-melting methods for forming textured fibers and single crystals of Bi—Sr—Ca—Cu—O compounds pounds have been disclosed by D. Gazit et al. (*J. Cryst. Growth* 91, 318 (1988)), S. Takekawa et al. (*J. Cryst. Growth* 92, 687 (1989)), and H. D. Brody et al. (*J. Cryst. Growth* 96, 225 (1989)). However, until the present invention no zone-melting method existed for forming such a textured microstructure in a thick film Bi—Sr—Ca—Cu—O material.

The present application discloses the fabrication of fully dense laser zone-melted Bi—Sr—Ca—Cu—O thick films with high critical current densities or $J_c$'s, in some cases over 2000 A/cm$^2$ at 77° K. and over 11,000 A/cm$^2$ at 60° K. These values are more than three orders of magnitude greater than those of similarly prepared, but sintered films.

SUMMARY OF THE INVENTION

A method in accordance with one aspect of the invention for preparing a highly aligned thick film of superconducting bismuth strontium calcium copper oxide ceramic material involves depositing on a suitable substrate a film about 5–200 μm thick of bismuth strontium calcium copper oxide. The ratios of Bi:(Sr, Ca):Cu are about 2:3:2 to 2:4:3. A laser beam is translated over the deposited film in a direction relative to the deposited film and at a rate of about 0.2–15 cm/hr while the deposited film is held at a temperature of about 500°–950° C. The beam is about 0.01–0.50 cm wide along the translation direction and provides about 0.2–10 W of optical power to the deposited film. The temperature and the beam translation rate, width, and optical power are selected to permit zone melting and resolidification of the deposited film to form the highly aligned thick film of superconducting bismuth strontium calcium copper oxide ceramic material.

In a more limited aspect of the invention, the resolidified film is annealed at about 900°–965° C. for about 1–300 hr.

BRIEF DESCRIPTION OF THE DRAWINGS

For a better understanding of the present invention, together with other objects, advantages and capabilities thereof, reference is made to the following Description and appended claims, together with the Drawings, in which:

DETAILED DESCRIPTION OF THE PREFERRED EMBODIMENTS

Figure 1:
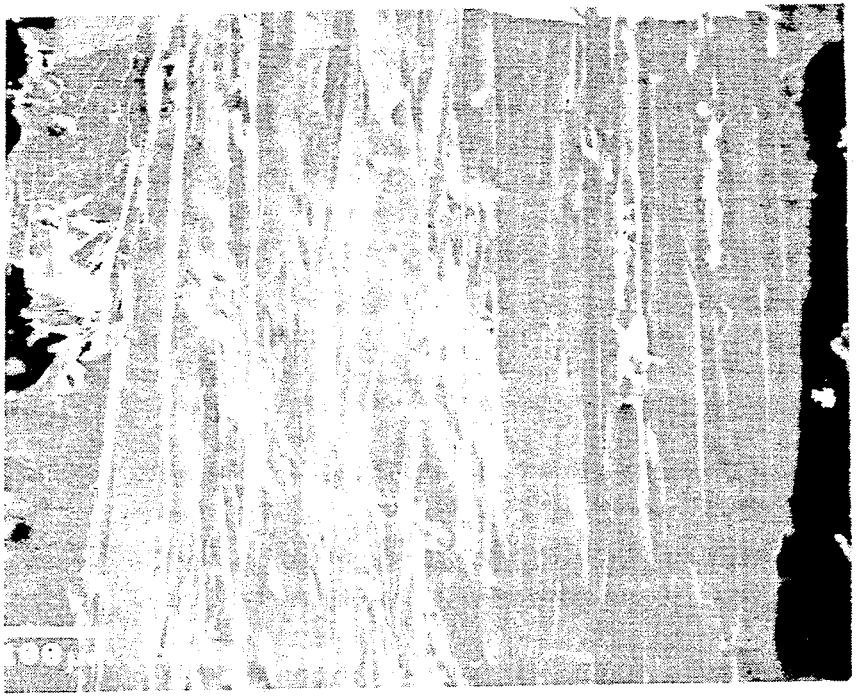
FIG. 1 is a scanning electron micrograph of the major exposed surface of a Bi—Sr—Ca—Cu—O thick film processed according to one aspect of the invention, illustrating the degree of texturing achieved.

The illustrative method described herein involves passing the beam of an argon laser lengthwise over a thick film sample in the form of a strip. Each strip is screen printed from a slurry made from a prepared powder of superconducting Bi—Sr—Ca—Cu—O material onto a single crystal MgO substrate, then is dried to remove the carrier or binder. The strip is progressively zone-melted through its entire thickness and across its width, then resolidified, as the translating beam reaches each cross-sectional portion of the deposited film and subsequently passes beyond that portion.

Ideally, there is no change in the composition of the liquid phase in the melt zone as it moves across the strip. However, in practice this may not be achieved. The composition of the resolidified material which forms at the trailing edge of the melt zone may be different from that of the liquid in the melt zone. Thus one or more constituents may tend to build up in the melt zone and be carried forward with it, changing in concentration in the melt. Since the chemical system is complex and poorly understood and an accurate phase diagram has not as yet been drawn up, the compounds being resolidified cannot be theoretically predicted. However, as the melt zone continues to move across the film, even if the above compositional differences occur, the composition of the resolidified material will reach steady state. Empirically, the composition of the starting material may be selected to produce a steady state resolidified material of the desired composition.

Use of laser beam exposure of controlled dimensions and careful control of the translation rate present the advantage of a small melt zone of controlled volume in which steady state resolidification may be reached more rapidly and reliably. It also means less vaporization of melt at the operating temperatures described herein. This control may be accomplished, for example, by focusing a central portion of the cross-sample length of the beam from a cylindrical lens onto a film sample narrower than the full width of the beam, for example a sample in the form of a strip. Thus the composition of the greater part of the film, i.e that solidified after steady state resolidification is achieved, is constant and empirically predictable for a given set of process parameters within the ranges stated herein.

Also within these ranges of process parameters, the microstructure of the material changes on resolidification, i.e. the material becomes fully dense and the grains recrystallize in an elongated form generally parallel to the direction of movement of the beam. This microstructural texturing, as discussed above, improves the superconducting properties of the thick film, particularly the critical current density.

Lasers other than the above-described argon ion laser may be used to carry out the method described herein, providing that sufficient power is available to produce a molten zone within the ranges of process parameters described herein. Optical systems other than the above-described cylindrical lens may be used to focus the laser beam. However, the exposure zone may be of a shape other than elliptical. Similarly, other single crystal or polycrystalline substrates may be used, for example any of those materials suitable for depositing superconducting thin films. Also, other methods may be used to deposit the thick film onto the substrate, and forms of thick film other than the strips described herein may be utilized.

In an exemplary method according to the invention, $Bi_2O_3$, $SrCO_3$, $CaCO_3$, and $CuO$ powders are mixed in molar proportions, Bi:Sr:Ca:Cu, of 2:2:2:3. The mixture is ball milled and calcined at least twice to form a powder of nominal composition $Bi_2Sr_2Ca_2Cu_3O_x$ wherein x is about 8-9. A thick film of this powder is formed by screening the powder to remove agglomerates, mixing the powder with a suitable carrier or binder, and screen-printing the mixture, e.g. in a strip, on a single crystal MgO substrate. The film is then dried, e.g. at 300° C. in air.

The substrates are heated, preferably in air or an oxidizing atmosphere, although the atmosphere is not critical, to a temperature below the liquidus temperature and are exposed to the beam of an argon laser. The beam is focused with a cylindrical lens to give an elliptical exposure zone of the desired dimensions and size. Preferably, the minor dimension of the exposure zone area is parallel to the direction of motion, and the major dimension is at least as wide as the transverse dimension of the film. Most preferably, the major dimension of this elliptical beam is significantly wider than the transverse dimension of the film, to maximize uniformity of optical power across the film. Since the melt zone in the film is created by exposure to the beam, material melting at the leading edge of the exposure zone and resolidifying behind its trailing edge, the melt zone generally will be approximately the same size as the exposure zone, and will closely follow and largely overlap with it.

The substrate and laser beam must be moving relative to one another as described below. Either the laser beam or the substrate may be in motion, or alternatively both may be in motion. However, the effective difference between their respective rates of motion must be within the range stated below. Thus a translating melt zone is created, which moves across the film as described above.

Translation rates of 0.2, 1, and 3 cm/hr were tested. At 0.2 cm/hr, some degree of a "beading" effect was observed in the strip samples, with periodic width and thickness variations of the solidified material in the direction of melting zone motion. This effect presumably was due to surface tension effects in the liquid. Strip dimensions were much more uniform at the two higher translation rates, and the best grain alignment was obtained at a rate of 1 cm/hr. Thus this rate of translation is preferred.

The optical power of the beam at the substrate necessary to create the required melt zone is dependent on several factors including the size of the exposure zone, the temperature of the substrate, the thickness of the film, and the translation rate. The optimum choice of processing conditions within the ranges recited in the appended claims may be easily determined by empirical means, but in any case must be selected to provide the recited zone melting and resolidification, preferably through the entire thickness of the film, to form the highly aligned grains of superconducting compound.

Several samples were prepared and zone-melted as described above using a translation rate of 1 cm/hr. The samples were annealed at 850° C. in air for 12, 65, or 137 hr, and furnace cooled. For comparison, one sample was not zone-melted, but was sintered for 12 hr at 850° C. in air and furnace cooled.

The samples were characterized by optical and scanning electron microscopy, and x-ray diffraction. For electrical measurements, silver contact pads were evaporated onto the strips in a four point configuration and a gold wire bonded to each contact using indium solder. The critical current density at ambient magnetic field was determined using 0.5 sec current pulses and an electric field criterion of 1 $\mu V/cm$. The accuracy of the calculated $J_c$ values was estimated to be $\pm 15\%$, principally due to difficulty in accurately determining the cross-sectional area of the samples.

In laser processed 20 $\mu m$ thick samples on substrates held at 700° C. and a translation rate of 1 cm/hr, melting and directional resolidification were achieved with total optical power over approximately a 0.1 mm×2.0 mm area at the substrate of at least 1.6 W. Between 1.2 and 1.6 W, substantial sintering was observed. At and above 2.0 W, significant texturing occurred with long grains parallel to the grain growth direction (direction of the melting zone motion) as shown in FIG. 1. At 2.4 W, some grains appeared to continue for almost the entire length of the sample. Thus, an optical power at the substrate of at least about 1.6 W is necessary to perform the process under these processing conditions. Generally, at least 2.0 W optical power at the substrate is preferred and at least 2.4 W most preferred.

Film thickness was determined by scanning electron microscopy on samples cleaved transversely to the grain growth direction, as shown in FIGS. 2-5. In all cases (except the sintered sample), the entire depth of the film had been melted. The fracture surfaces showed mostly plate-like grains oriented at angles less than 25° from parallel to the substrate. At the higher laser power levels, apparent surface tension in the liquid resulted in solidified strips which were narrower than initially and with a convex crosssection. Average thicknesses were about 20 μm.

Figure 6:
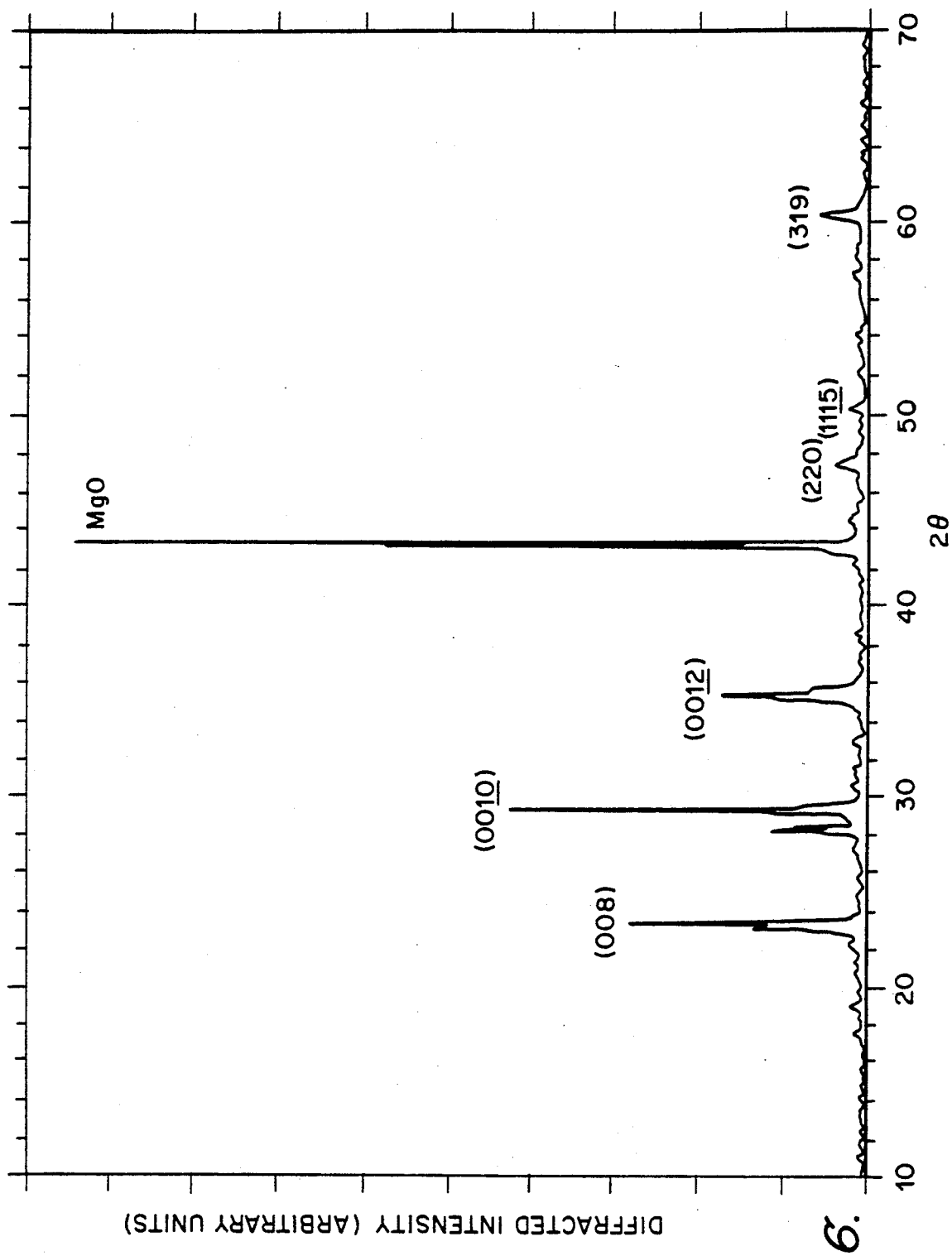
FIG. 6 is a graphical representation of x-ray diffraction data obtained from an unannealed sample processed according to an aspect of the invention.

X-ray diffraction data for an unannealed strip processed at 2.0 W is shown in FIG. 6. The pattern is consistent with the $Bi_2(Sr, Ca)$ phase with a strongly preferred orientation of the c-axis normal to the substrate. This data is consistent with the grain orientations seen in cleaved samples, because grains with c-axes at small angles from normal would contribute no diffracted intensity in the usual powder pattern geometry.

Figure 7:
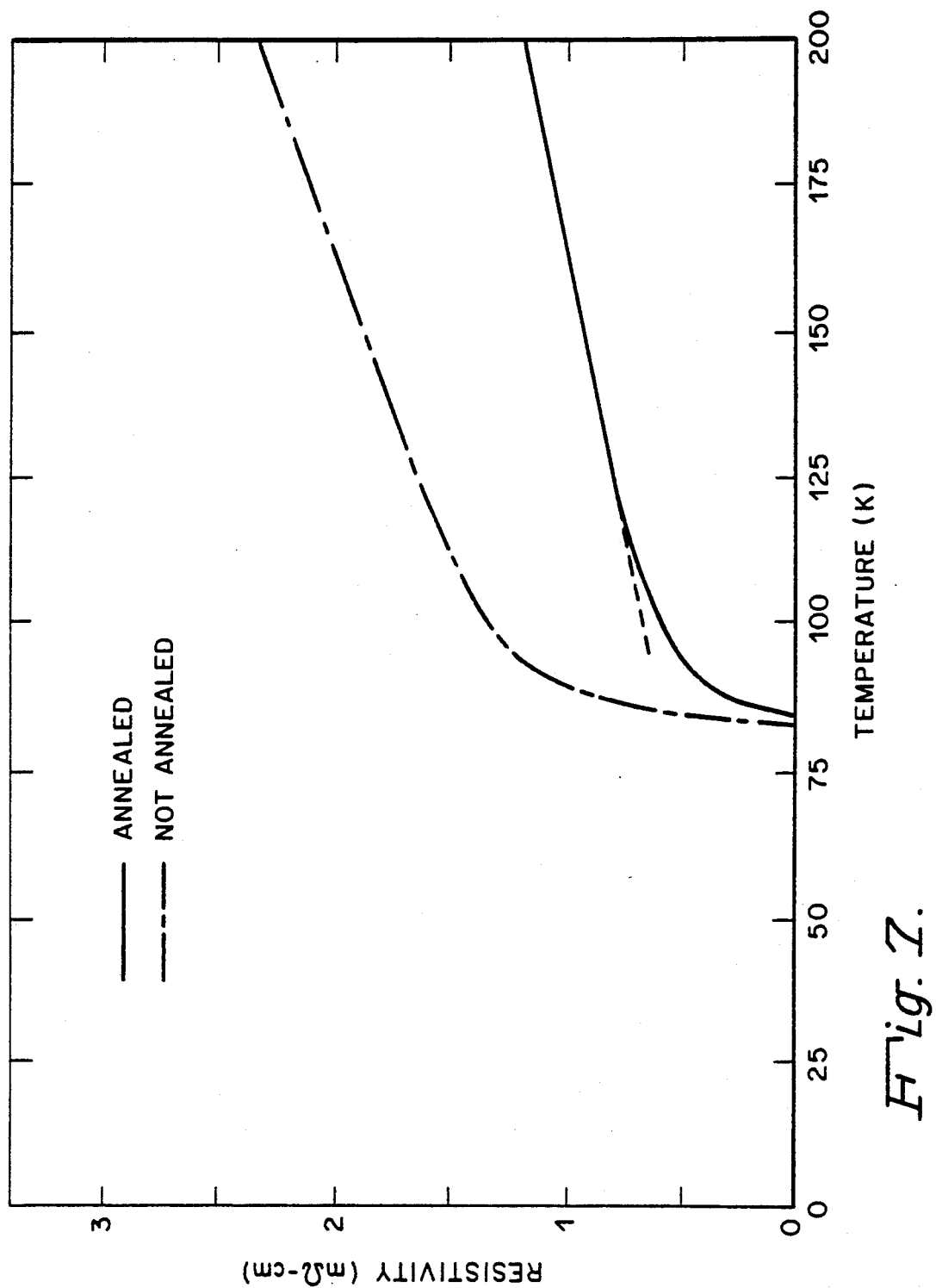
FIG. 7 is a graphical representation of the variation of resistivity with temperature for typical samples processed according to different aspects of the invention, annealed and unannealed, showing their critical temperatures, $T_c$.

Resistivities at low temperatures for a typical unannealed sample are shown in FIG. 7. Although the x-ray spectra of FIG. 6 shows that almost none of the high critical temperature $Bi_2Sr_2Ca_2Cu_3O_x$ phase was evident, high $J_c$'s were obtained in the unannealed samples. FIG. 7 shows the point of zero resistance occurring at about 80° K. Room temperature resistivities for the unannealed samples were 2-5 mΩ-cm. Critical current densities at 77° K. ranged from about 10 A/cm$^2$ for samples with $T_c=79°$ K., to 450 A/cm$^2$ for a sample with $T_c=82°$ K. At 60° K., about 75% of $T_c$, eight samples processed with laser powers above 2.0 W averaged 3300 A/cm$^2$ for $J_c$, and the best sample exhibited $J_c$ of 5400 A/cm$^2$. The current density data at low temperatures used in FIG. 8 for the unannealed sample is that derived using this best unannealed sample. There was no apparent increase in $J_c$ with laser power between 2.0 W and 2.4 W.

After annealing, the samples all showed a sublinear resistance drop of about 10% between 115° and 100° K., indicating the presence of a small amount of the high $T_c$ phase, and their room temperature resistivities of 1-2 mμ-cm were all somewhat lower than those of the unannealed samples. However, samples annealed for 12 hr all exhibited a decrease of $T_c(R=0)$ to 78°-79° K. $J_c$ was typically a few A/cm$^2$ at 77° K. At 60° K. the average for six samples was 4870 A/cm$^2$, and the best was 5600 A/cm$^2$. The current density data at low temperatures used in FIG. 8 for the sample annealed for 12 hr is that derived using this latter sample.

Figure 8:
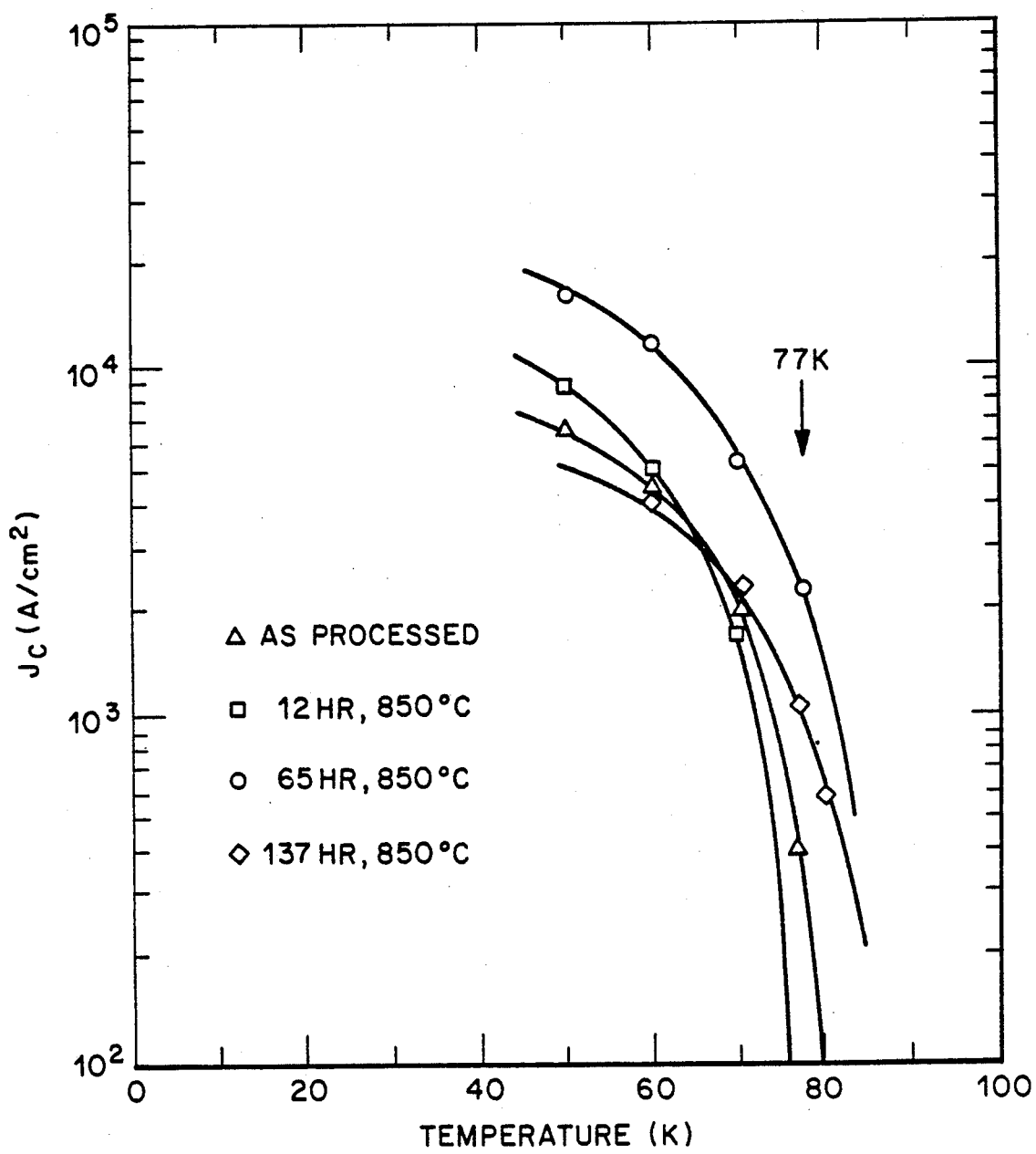
FIG. 8 is a graphical representation of the variation of current density with temperature for best samples processed according to different aspects of the invention, one unannealed sample and samples annealed for varying lengths of time, showing the critical current densities, $J_c$.

Samples annealed for 65 h and 137 h showed an increase in $T_c$ to 83°-85° K., as shown in FIG. 7. FIG. 8 shows that the current density of the best 65 hr annealed sample was 2200 A/cm$^2$ at 77° K. and 11,200 A/cm$^2$ at 60° K. On the other hand, current densities in samples annealed for 137 hr were not as high as in those annealed for 65 hr, although their normal state resistivities and $T_c$ were similar. The current density of the best sample annealed for 137 hr was 1000 A/cm$^2$ at 77° K. and 4100 A/cm$^2$ at 60° K. (FIG. 8).

The sample which had only been sintered showed $T_c(R=0)$ at 70 K and $J_c$ of about 5 A/cm$^2$ at 60° K., more than three orders of magnitude less than that of the best zone melted samples.

The following Examples are presented to enable those skilled in the art to more clearly understand and practice the present invention. These Examples should not be considered as a limitation upon the scope of the present invention, but merely as being illustrative and representative thereof.

EXAMPLES 1-4

A powder mixture was formulated by mixing $Bi_2O_3$, $SrCO_3$, $CaCO_3$, and CuO powders in molar proportions, Bi:Sr:Ca:Cu, of 2:2:2:3. The mixture was ball milled and calcined twice to form a $Bi_2Sr_2Ca_2Cu_3O_x$ nominal composition powder. The powder was screened to isolate the 325 mesh portion. Four thick films of the screened powder were formed by mixing the powder with a commercial binder, #400 vehicle, Electro-Science Laboratories, King of Prussia, Penna., and screen-printing the mixture in strips on single crystal MgO substrates. The films were then dried at 300° C. for 2 hr to remove the binder. The average thickness of each film was about 20 μm.

Each of the first three substrates was placed on an enclosed hot stage held at 700° C. in air, and the stage traversed under the beam of an Ar ion laser so as to move a molten zone along the length of the strip. The beam was focused with a cylindrical lens to give an approximately elliptical zone of major and minor axes approximately 2 mm and approximately 0.1 mm respectively, with the minor axis parallel to the direction of motion. The remaining zone-melting conditions are shown in the Table below. The three samples were then annealed in air for 12 hr at 850° C. The fourth substrate was heated in air at 850° C. for 12 hr, but was not submitted to the zone-melting process.

TABLE

| Example No. | Substrate Temp., °C. | Laser Power, Watts | Translation Rate, cm/hr | Anneal, hr @ °C. |
|---|---|---|---|---|
| 1 | 700 | 2.2 | 2 | 12 @ 850 |
| 2 | 700 | 2.0 | 2 | 12 @ 850 |
| 3 | 700 | 2.2 | 1 | 12 @ 850 |
| | | | | Sintering hr @ °C. |
| 4 | 700 | — | — | 12 @ 850 |

Figure 2:
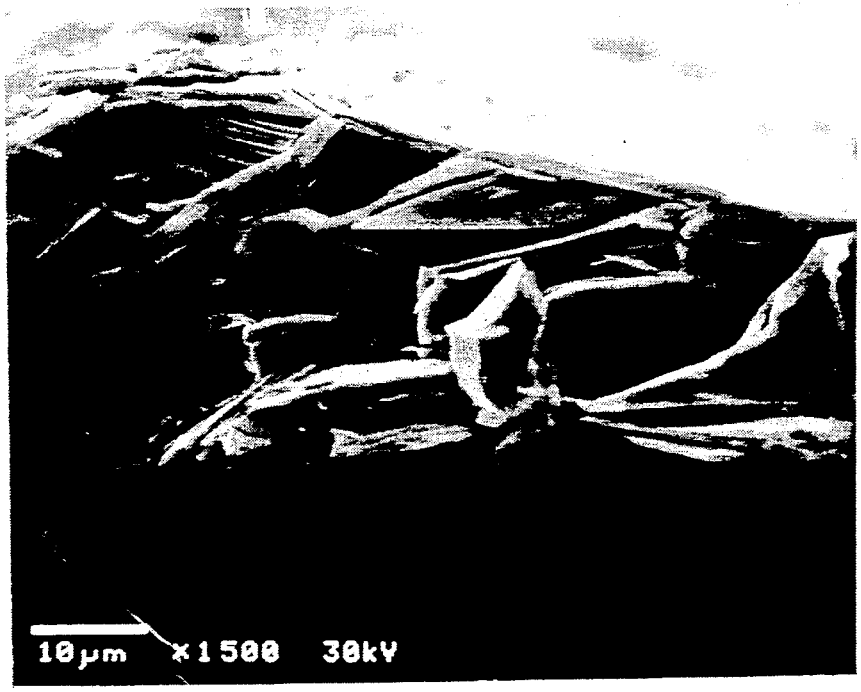
FIG. 2 is a scanning electron micrograph of a fractured cross section of the Bi—Sr—Ca—Cu—O thick film of FIG. 1, illustrating the degree of texturing achieved.
Figure 3:
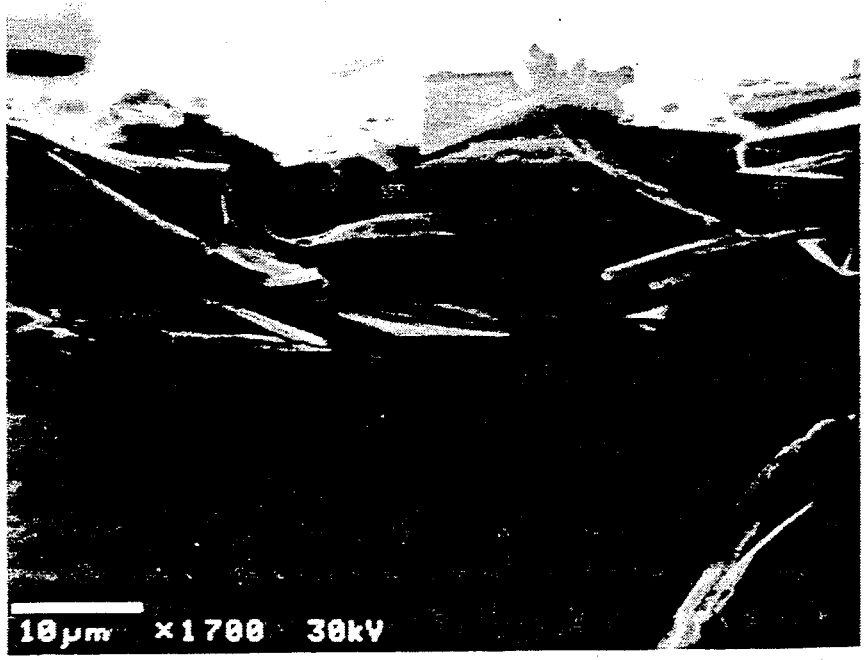
FIGS. 3–4 are scanning electron micrographs of fractured cross sections of other Bi—Sr—Ca—Cu—O thick films processed according to different aspects of the invention, illustrating the degree of texturing achieved.
Figure 4:
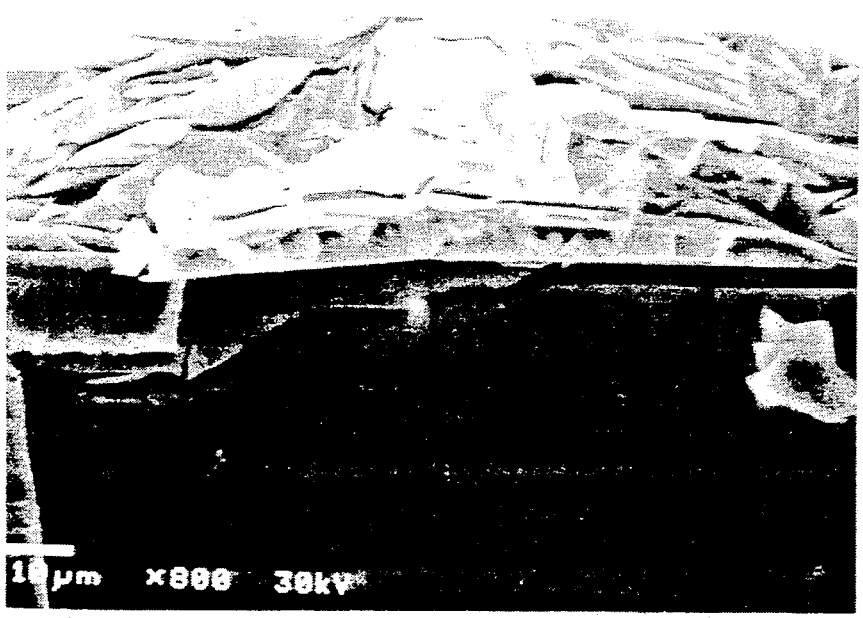

The resulting products are shown in FIGS. 1-5. FIGS. 1 and 2 are photomicrographs of the sample of Example 1, FIG. 1 showing the surface characteristics of the sample, and FIG. 2, a cross-sectional fracture surface. Both FIGS. illustrate the texturing of the thick film, clearly showing the alignment of elongated grains within the film. Similarly, FIGS. 3 and 4 illustrate the texturing of the thick films of Examples 2 and 3, respectively, in cross-sectional fracture surface photomicrographs.

Figure 5:
FIG. 5 is a scanning electron micrograph of a fractured cross section of a Bi—Sr—Ca—Cu—O thick film processed according to the prior art, illustrating the lack of texturing achieved.

The texturing of the zone melted samples may be contrasted with the lack of texturing in the non-zone melted sample of Example 4, as illustrated in the cross-sectional fracture surface shown in FIG. 5. The grains shown in FIG. 5 are equiaxed rather than elongated, presenting a greater number of grain boundaries and a random arrangement of the a-b axes. Thus critical current density in the material of Example 4 is lower than those of the aligned materials of Examples 1-3.

The method according to the present invention provides a high density thick film having a textured microstructure of highly aligned, elongated grains of high temperature superconducting Bi—Sr—Ca—Cu—O compounds exhibiting improved critical current carrying capacity, $J_c$. In some cases $J_c$'s above 2000 A/cm$^2$ at a temperature of 77° K. and above 11,000 A cm$^2$ at 60° K. have been achieved, more than three orders of magnitude greater than those of similarly prepared, but sintered films. These materials are useful for applications such as those involving chip-to-chip interconnects and passive microwave devices.

While there have been shown and described what are at present considered the preferred embodiments of the invention, it will be obvious to those skilled in the art that various changes and modifications can be made therein without departing from the scope of the invention as defined by the appended claims.

I claim:
1. A method for preparing a highly aligned thick film of superconducting bismuth strontium calcium copper oxide ceramic material comprising the steps of:
    depositing on a suitable substrate a film about 5-200 μm thick of bismuth strontium calcium copper oxide wherein the ratios of Bi:(Sr, Ca):Cu are about 2:3:2 to 2:4:3; and
    translating a laser beam over said deposited film in a direction relative to said deposited film and at a rate of about 0.2-15 cm/hr while said deposited film is held at a temperature of about 500°-950° C., wherein said beam is about 0.01-0.50 cm wide along said direction and provides about 0.2-10 W of optical power to said deposited film, and wherein said temperature and said beam translation rate, width, and optical power are selected to permit zone melting and resolidification of said deposited film to form said highly aligned thick film of superconducting bismuth strontium calcium copper oxide ceramic material.

2. A method in accordance with claim 1 wherein the laser beam translating step is carried out in air or an oxidizing atmosphere.

3. A method in accordance with claim 1 further comprising the step of annealing said resolidified film at about 900°-965° C. for about 1-300 hr.

4. A method in accordance with claim 2 wherein the annealing step is carried out in air or an oxidizing atmosphere.

5. A method for preparing a highly aligned thick film of superconducting bismuth strontium calcium copper oxide ceramic material comprising the steps of:
    depositing on a MgO substrate a film about 20 μm thick of bismuth strontium calcium copper oxide wherein the ratios of Bi:Sr:Ca:Cu are about 2:2:2:3; and
    translating a laser beam over said deposited film in a direction relative to said deposited film and at a rate of about 0.2-3.0 cm/hr while said deposited film is held at a temperature of about 500°-950° C., wherein said beam is about 0.01-0.50 cm wide along said direction of translation, and provides about 2.0-2.4 W of optical power to said deposited film, and wherein said temperature and said beam translation rate, width, and optical power are selected to permit zone melting and resolidification of said deposited film to form said highly aligned thick film of superconducting bismuth strontium calcium copper oxide ceramic material;
    annealing said resolidified film at about 900°-965° C. for about 12-137 hr.

* * * * *